United States Patent
Jeloka et al.

(10) Patent No.: US 12,159,659 B2
(45) Date of Patent: Dec. 3, 2024

(54) RAMP WRITE TECHNIQUES

(71) Applicant: Arm Limited, Cambridge (GB)

(72) Inventors: Supreet Jeloka, Austin, TX (US);
Mudit Bhargava, Austin, TX (US);
Pranay Prabhat, Cambridge (GB);
Fernando Garcia Redondo, Cambridge (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/107,725

(22) Filed: Nov. 30, 2020

(65) Prior Publication Data

US 2022/0172762 A1 Jun. 2, 2022

(51) Int. Cl.
*G11C 11/16* (2006.01)

(52) U.S. Cl.
CPC ...... *G11C 11/1675* (2013.01); *G11C 11/1673* (2013.01); *G11C 11/1677* (2013.01)

(58) Field of Classification Search
CPC ............ G11C 11/1675; G11C 11/1673; G11C 11/1677
See application file for complete search history.

(56) References Cited

U.S. PATENT DOCUMENTS

| | | | | |
|---|---|---|---|---|
| 8,902,627 B1* | 12/2014 | Pesavento | ............ | G11C 29/028 365/191 |
| 2008/0151601 A1* | 6/2008 | Kang | ................ | G11C 13/0069 365/189.16 |
| 2008/0180990 A1* | 7/2008 | Lung | ................ | G11C 13/0064 365/163 |
| 2011/0216580 A1* | 9/2011 | Berger | ............... | G11C 11/1673 365/158 |
| 2012/0087192 A1* | 4/2012 | Fang | ...................... | G11C 16/10 365/185.19 |
| 2016/0118102 A1* | 4/2016 | Abedifard | .......... | G11C 11/1693 365/158 |
| 2018/0308546 A1* | 10/2018 | Tomita | ............... | G11C 13/0026 |
| 2020/0258585 A1* | 8/2020 | Lee | ........................ | G11C 16/08 |

OTHER PUBLICATIONS

Wei, et al.; A 7Mb STT-MRAM in 22FFL FinFET Technology with 4ns Read Sensing Time at 0.9V Using Write-Verify-Write Scheme and Offset-Cancellation Sensing Technique; 2019 IEEE International Solid-State Circuits Conference—(ISSCC); Feb. 2019.

Dong, et al.; A 1Mb 28nm STT-MRAM with 2.8ns Read Access Time at 1.2V VDD Using Single-Cap Offset-Cancelled Sense Amplifier and In-situ Self-Write-Termination; 2018 IEEE International Solid-State Circuits Conference—(ISSCC); Feb. 2018.

* cited by examiner

*Primary Examiner* — Uyen Smet
(74) *Attorney, Agent, or Firm* — Pramudji Law Group PLLC; Ari Pramudji

(57) ABSTRACT

Various implementations described herein are related to a method. The method may apply a write control voltage to a bitcell. The method may gradually ramp the write control voltage to the bitcell. The method may terminate application of the write control voltage to the bitcell when a write operation is sensed in the bitcell.

24 Claims, 10 Drawing Sheets

RAMP WRITE TECHNIQUES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some modern circuit designs, conventional memory devices may use pulse amplitude modulation along with verify cycles to perform a write operation. In some cases, a lower amplitude can be used initially because endurance of some memory devices are sensitive to voltage being applied across its components. In other cases, a higher current and a higher voltage is applied to some memory devices for writability, which often causes its components to have lower endurance. As such, there exists a need for some memory devices to have higher endurance along with efficient writability attributes.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to intelligent ramp write schemes and techniques for non-volatile memory (NVM) applications in various physical circuit designs. For instance, the various schemes and techniques described herein may provide a voltage ramp for writing to NVM cells having a magneto-resistive random access memory (MRAM) structure so as to improve write energy and endurance.

The various ramp write schemes and techniques described herein overcome the deficiencies and resolve endurance issues of some conventional memory devices by using a ramped write voltage pulse and a continuous read-verify operation. The various ramp write schemes and techniques described herein also operate to improve endurance by applying the smallest and/or shortest write voltage possible to flip or change the logical state of a data-bit stored in a bitcell. Also, the various ramp write schemes and techniques described herein further operate to conserve write power by providing early termination of the write voltage and by reducing the write pulse width.

In some implementations, the ramp write schemes and techniques described herein provide a method that applies a write control voltage to a bitcell and also gradually ramps the write control voltage to the bitcell. Moreover, the method terminates application of the write control voltage to the bitcell when a write operation is sensed in the bitcell. In some instances, the method gradually ramps the write control voltage to the bitcell, e.g., by gradually increasing the write control voltage to the bitcell so as to provide one or more of improved endurance, faster write speed and energy savings. Also, in some instances, the method gradually ramps the write control voltage to the bitcell by abruptly increasing the write control voltage to the bitcell in an initial phase followed by gradually increasing the write control voltage to the bitcell during a continuous ramping phase.

The bitcell architecture may refer to various non-volatile memory (NVM), such as, e.g., magneto-resistive random access memory (MRAM). The bitcell architecture may include memory circuitry having a core array of bitcells that are accessible via data access lines, such as one or more wordlines and bitlines. In some NVM applications, data access lines refer to complementary bitlines (BL, NBL), and in MRAM applications, data access lines refer to at least one bitline (BL) and at least one source line (SL).

Various implementations of providing ramp writing schemes and techniques for non-volatile memory (NVM) will be described herein with reference to FIGS. 1-6.

Figure 1:
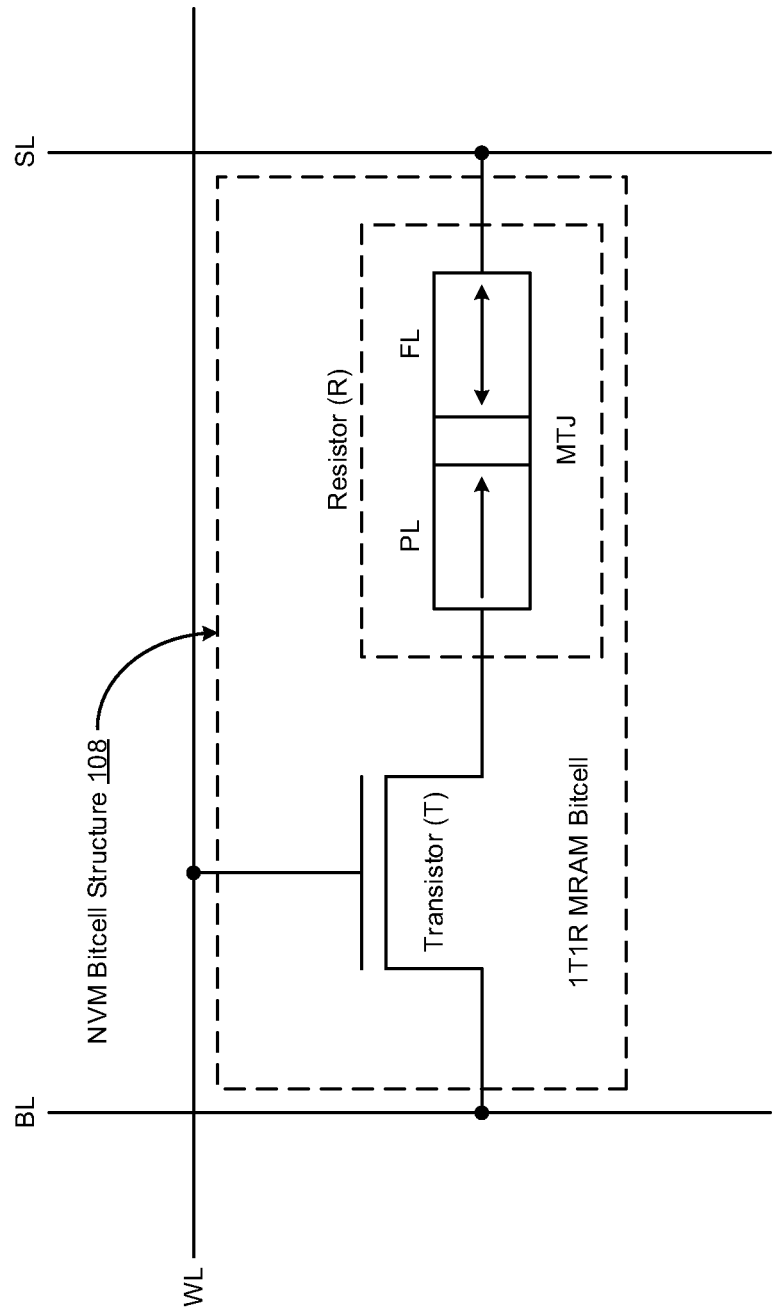
FIG. 1 illustrates a diagram of bitcell architecture in accordance with various implementations described herein.

FIG. 1 illustrates a diagram 100 of bitcell architecture 104 in accordance with various implementations described herein.

In some implementations, the bitcell architecture 104 may be implemented as a system or a device having various integrated circuit (IC) components that are arranged and coupled together as an assemblage or combination of parts that provide for physical circuit designs and various related structures. In some instances, a method of designing, providing and building the bitcell architecture 104 as an integrated system or device may involve use of various IC circuit components described herein so as to thereby implement ramp writing schemes and techniques associated therewith. Also, the bitcell architecture 104 may be integrated with computing circuitry and related components on a single chip, and the bitcell architecture 104 may be implemented in various embedded systems for automotive, electronic, mobile, server and Internet-of-things (IoT) applications.

As shown in FIG. 1, the bitcell architecture 104 may be implemented with a non-volatile memory (NVM) bitcell structure 108, such as, e.g., magneto-resistive random access memory (MRAM) bitcell structure. For instance, in various implementations, the NVM bitcell structure 108 may be configured with a 1T1R MRAM bitcell having a transistor component (1T) and a resistor component (1R). In some instances, the transistor (T) may refer to an N-type MOS (NMOS) transistor, and also, the resistor (R) may refer to magnetic based resistor having a magnetic tunneling junction (MTJ) interposed between a pinned layer (PL) and a free layer (FL). In reference to this MTJ MRAM bitcell, data is stored with the magnetic storage elements that are formed from the two ferromagnetic plates (PL, FL) separated by a thin insulating layer (MTJ). The pinned layer (PL) refers to a permanently magnetized plate having a set polarity, and also, the free layer (FL) refers to a selectively magnetized plate having a changeable polarity that matches or is opposite to the polarity of the pinned layer (PL). When sensing for resistance, the aligned polarities provide lower resistance for representing a first readable logical data state, and the opposing polarities provide higher resistance for a second readable logical data state. As such, a logical zero (0) or a logical one (1) may be stored in the MTJ MRAM bitcell, e.g., based on a sensed resistance level through the MTJ MRAM bitcell. However, even though an MRAM bitcell structure is shown and described in FIG. 1, any other type of NVM bitcell may be used to achieve similar results of the ramp writing techniques disclosed herein.

The bitcell architecture 104 may be implemented with one or more core arrays of bitcells or memory cells, wherein each bitcell may be configured to store at least one data-bit value (e.g., data value related to a logical '0' or '1'). The one or more core arrays may include any number of bitcells arranged in various configurations, such as, e.g., two-dimensional (2D) memory arrays having any number of columns and any number of rows of multiple bitcells, which may be arranged in a 2D grid pattern for read and write memory access. Also, each bitcell may be implemented with any type of NVM memory, including, e.g., magneto-resistive random access memory (MRAM) and/or any other type of useable NVM memory. Also, each bitcell may have a multi-layer MRAM bitcell with a pinned layer (PL) and a free layer (FL), and for data access, each bitcell may include a wordline (WL), and in MRAM, the bitlines may refer to a bitline (BL) and a source line (SL).

Figure 2:
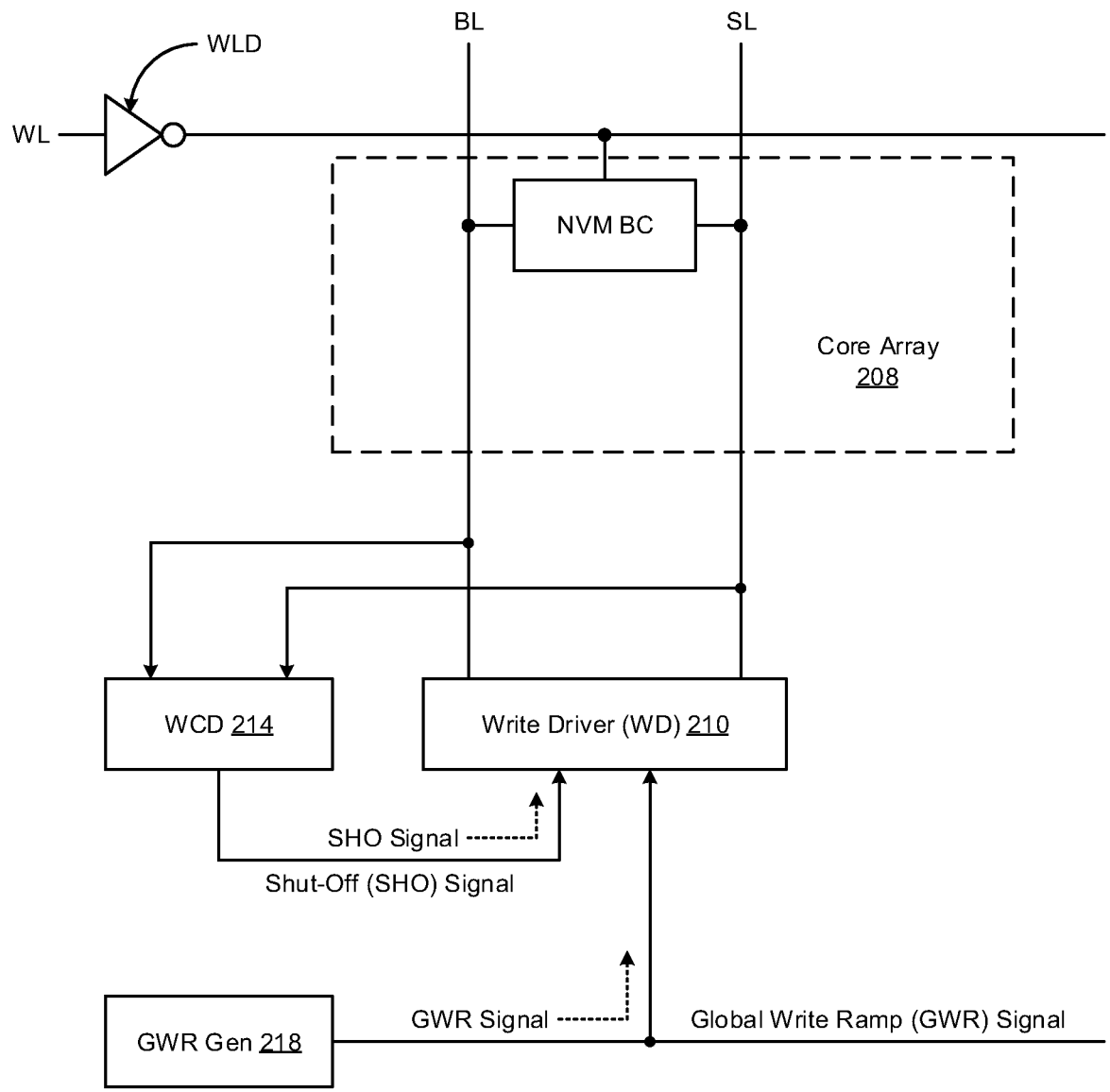
FIG. 2 illustrates a diagram of ramp write architecture in accordance with various implementations described herein.

FIG. 2 illustrates a diagram 200 of ramp write architecture 204 in accordance with various implementations described herein. In some implementations, the ramp write architecture 204 may be referred to as intelligent ramp write architecture.

In various implementations, the bitcell architecture 104 may be implemented as a system or a device having various integrated circuit (IC) components that are arranged and coupled together as an assemblage or combination of parts that provide for physical circuit designs and various related structures. In some instances, a method of designing, providing and building the ramp write architecture 204 as an integrated system or device may involve the use of various IC circuit components described herein so as to implement ramp writing schemes and techniques associated therewith. The ramp write architecture 204 may be integrated with computing circuitry and related components on a single chip, and the ramp write architecture 204 may be implemented in various embedded systems for automotive, electronic, mobile, server and Internet-of-things (IoT) applications.

As shown in FIG. 2, the ramp write architecture 204 may include a core array 208 having at least one bitcell (BC), such as, e.g., an NVM bitcell, and a worldline driver (WLD) coupled to the bitcell (BC) via a wordline (WL). Also, data stored in the bitcell (BC) may be accessed via the wordline (WL), bitline (BL) and/or source line (SL).

The ramp write architecture 204 may include a write driver (WD) 210 that may be configured to apply a write control voltage signal to the bitcell (BC) via the bitline (BL) or the source line (SL), gradually ramp the write control voltage signal to the bitcell (BC), and terminate application of the write control voltage signal to the bitcell (BC) when the write operation is sensed in the bitcell via the source line (SL). In some instances, the write driver (WD) 210 gradually ramps the write control voltage to the bitcell (BC) by gradually increasing the write control voltage to the bitcell (BC). In some instances, the write driver (WD) 210 gradually ramps the write control voltage to the bitcell (BC) by abruptly increasing the write control voltage to the bitcell (BC) in an initial phase and then followed by gradually increasing the write control voltage to the bitcell (BC) during a ramping phase. Moreover, the write driver (WD) 210 may be configured to generate the write control voltage for the bitcell (BC) with capacitor based circuitry (or similar circuitry) to thereby slowly, gradually and/or continuously increase the write control voltage over a period of time during a write cycle. The write driver (WD) 210 may be configured to gradually increase (ramp) the write control voltage to the bitcell (BC) during a single ramp cycle of a write cycle.

The ramp write architecture 204 may include a write completion detector (WCD) 214 that is configured to sense the write operation in the bitcell (BC). In some instances, the write completion detector (WCD) 214 pre-reads and pre-verifies a logical state of the bitcell (BC) before the write driver (WD) 214 applies the write control voltage to the bitcell (BC), and also, the write completion detector (WCD) 214 continuously reads and verifies the logical state of the bitcell (BC) while the write driver (WD) 214 radually increases (or ramps) the write control voltage to the bitcell (BC). In other instances, the write completion detector (WCD) 214 may intermittently read and verify the logical state of the bitcell (BC) while the write driver (WD) 210 gradually increases (or ramps) the write control voltage to the bitcell (BC). Moreover, the write completion detector (WCD) 214 may sense when the write operation occurs by sensing a change or flip in a logical state of the bitcell (BC), and the write completion detector (WCD) 214 may generate the shut-off control signal (SHO) when the change in the logical state of the bitcell (BC) is sensed. The write completion detector (WCD) 214 may provide the shut-off control signal (SHO) to the write driver (WD) 210 so that the write driver (WD) 210 terminates application of the write control voltage to the bitcell (BC) when the change in the logical state of the bitcell (BC) is sensed.

The ramp write architecture 204 may also include a global write ramp (GWR) generator 218 that is configured to generate and provide a GWR signal to the write driver (WD) 210. In some implementations, the write driver (WD) 210 is configured to receive the GWR signal from the GWR generator 218 and provide a bitline (BL) signal or a source line signal (SL) to the bitcell (BC) based on the GWR signal. The ramp (i.e., the gradually increasing ramping signal) may be provided on the BL or the SL depending on the polarity of the write (0/1), while the other signal SL or BL is kept at ground (GND or VSS). In some instances, the GWR signal may refer to a slow ramping signal that gradually and/or continuously increases over a period of time during a write cycle so as to thereby provide improved endurance, faster write speed and energy savings to the ramp write architecture 204. Also, in some instances, when the logic state of the bitcell (BC) needs to be flipped, the write driver (WD) 210 is configured to provide for an early termination of the bitline (BL) signal or the source line (SL) signal so as to improve endurance of the bitcell (BC) and also to increase write speed of the bitcell (BC) during write operations. Further scope, behavior and characteristics associated with these slow ramp writing schemes and techniques is described in greater detail herein below in FIGS. 3 and 4A-4C.

Figure 3A:
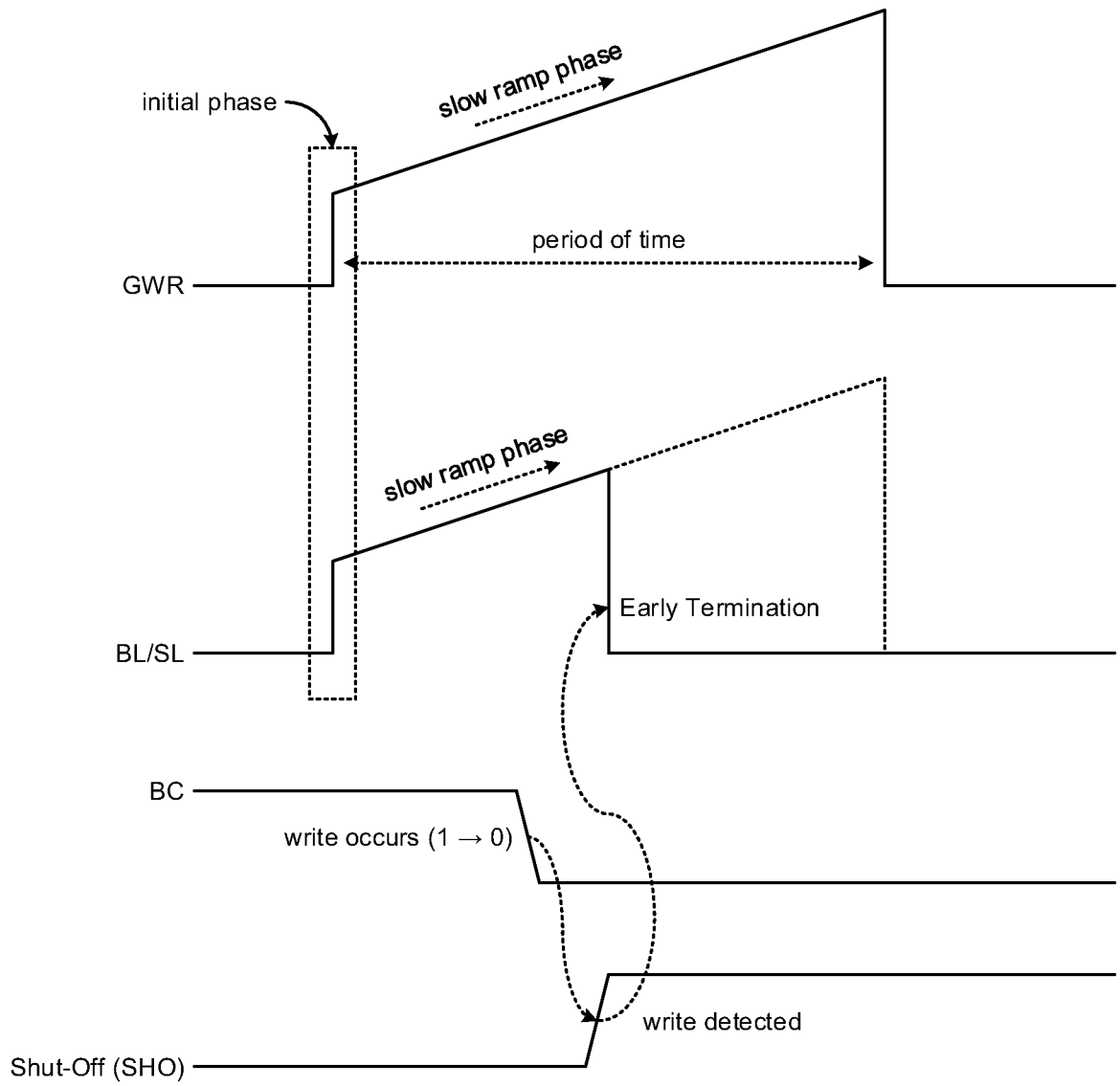
FIG. 3A illustrates a waveform diagram of providing a ramp write technique in accordance with various implementations described herein.
Figure 3B:
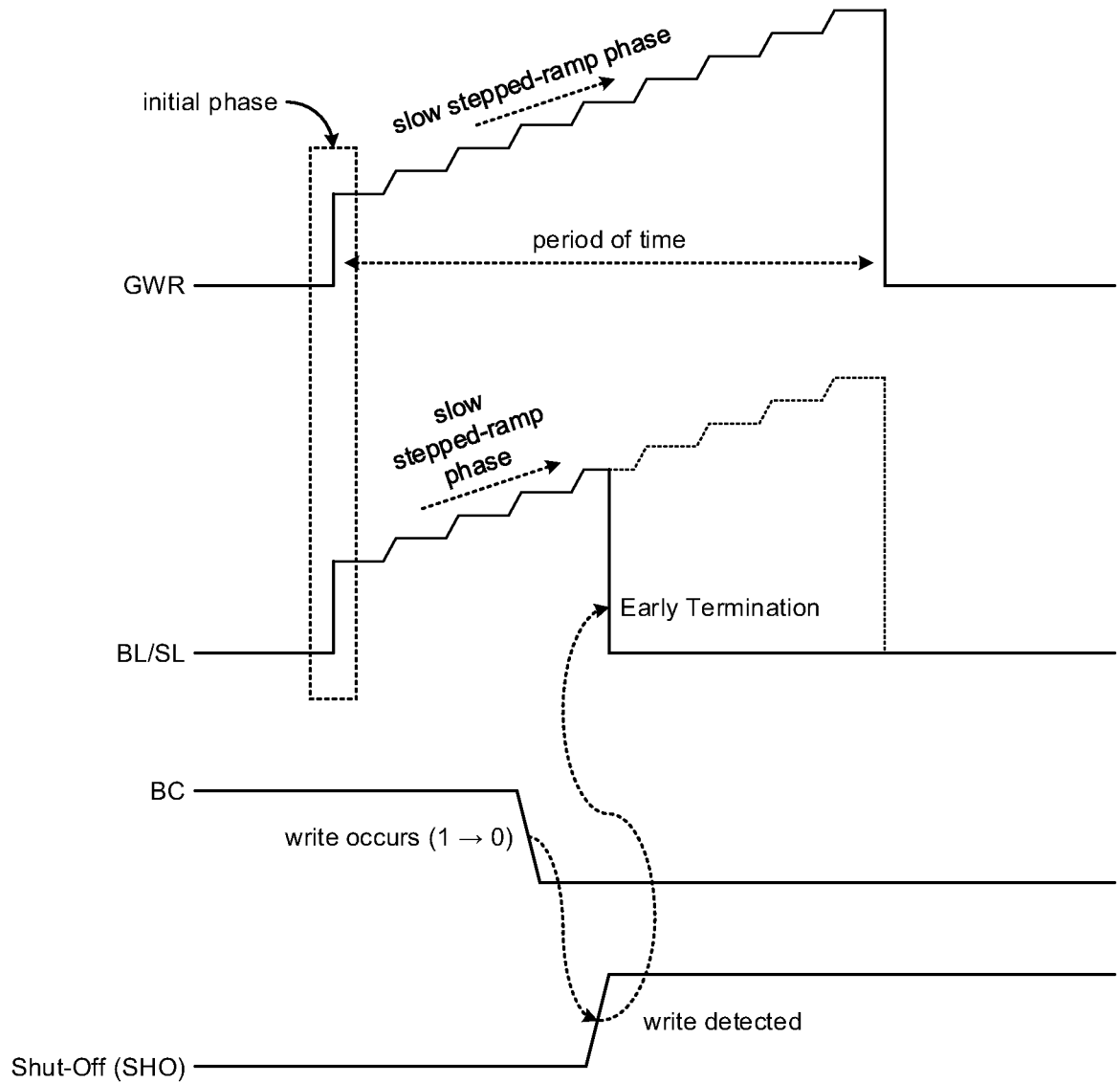
FIG. 3B illustrates a waveform diagram of providing a stepped-ramp write technique in accordance with various implementations described herein.

FIGS. 3A-3B illustrate various waveform diagrams related to write techniques in accordance with implementations described herein. In particular, FIG. 3A shows a waveform diagram 300A of providing a ramp write technique 304A, and FIG. 3B shows a waveform diagram 300B of providing a stepped-ramp write technique 304B.

In various implementations, the ramp write techniques 304A-304B may be implemented with a system or a device having integrated circuit (IC) components that are arranged and coupled together as an assemblage or combination of parts that provide for physical circuit designs. In various instances, a method of implementing the ramp write techniques 304A-304B with an integrated system or device may involve use of the various IC circuit components described herein so as to implement ramp writing schemes and techniques associated therewith. The ramp write techniques 304A-304B may be used by computing circuitry and related components on a single chip in reference to embedded systems for automotive, electronic, mobile, server and IoT applications.

As shown in FIG. 3A, the ramp write technique 304A may implement and involve use of the global write ramp (GWR) signal for applying a write control voltage to a bitcell via a bitline (BL) or source line (SL). In some instances, the GWR signal refers to a slow ramping signal over a period of time, wherein the GWR signal gradually and continuously increases over the period of time during a slow ramp phase. In reference to the bitline (BL) or source line (SL), the ramp write technique 304A gradually ramps the write control voltage to the bitcell (BC), and then the ramp write technique 304A provides for early termination of the write control voltage to the bitcell when the write operation is sensed in the bitcell (BC). For instance, the ramp write technique 304A may gradually ramp the write control voltage to the bitcell (BC) by gradually increasing the write control voltage to the bitcell so as to provide one or more of improved endurance, faster write speed and/or energy savings. Also, in some instances, the ramp write technique 304A may gradually ramp the write control voltage to the bitcell by abruptly increasing the write control voltage to the bitcell in an initial phase followed by gradually increasing the write control voltage to the bitcell during a continuous ramping phase.

In some implementations, the ramp write technique 304A may generate the write control voltage for the bitcell with capacitor based circuitry (or other similar circuitry) so as to slowly, gradually and/or continuously increase (or ramp) the write control voltage over a period of time during a slow ramping phase of a write cycle. Also, in various instances, the ramp write technique 304A may pre-read and pre-verify a logical state of the bitcell prior to applying the write control voltage. The ramp write technique 304A may pre-read the logical state of the bitcell and then write to the bitcell only if the data-bit needs to be changed or flipped (e.g., write occurs, 0 to 1, or 1 to 0), and thus, any data-bit in which a new state equals an old state, the slow ramp is not provided since the data-bit does not need to be changed or flipped. Also, in various instances, the ramp write technique 304A may continuously read and verify a logical state of the bitcell while gradually ramping the write control voltage to the bitcell. Moreover, the ramp write technique 304A may further intermittently read and verify a logical state of the bitcell while gradually ramping the write control voltage to the bitcell.

In some implementations, the ramp write technique 304A may be configured to sense when the write operation occurs by sensing a change in a logical state of the bitcell and then generate a shut-off control signal (SHO) when the change in the logical state of the bitcell is sensed, such as, e.g., when a write is detected. Therefore, in this particular moment, the ramp write technique 304A may apply the shut-off control signal (SHO) to the write driver that is coupled to the bitcell so that the write driver terminates application of the write control voltage to the bitcell when the change in the logical state of the bitcell is sensed, such as, e.g., when or after a write is detected. Also, the ramp write technique 304A may be performed within a single continuous ramp cycle of a write cycle. Additional scope, behavior and characteristics associated with these slow ramp writing schemes and techniques is described in greater detail herein below in FIGS. 4A-4C.

In various implementations, the stepped-ramp write technique 304B shown in FIG. 3B may be used to generate a stepped write control voltage for the bitcell with capacitor based circuitry (or other similar circuitry) so as to slowly and gradually provide a stepped increase (or stepped ramp) of the write control voltage over a period of time during a slow stepped-ramping phase of a write cycle. Also, in some instances, the stepped-ramp write technique 304B may pre-read and pre-verify a logical state of the bitcell prior to applying the write control voltage to the bitcell. The stepped-ramp write technique 304B may pre-read the logical state of the bitcell and then write to the bitcell only if the data-bit needs to be changed or flipped (e.g., write occurs, 0 to 1, or 1 to 0), and thus, any data-bit in which a new state equals an old state, the slow stepped-ramp may not be not provided since the data-bit does not need to be changed or flipped. Also, in various instances, the steep-ramp write technique 304B may continuously read and verify a logical state of the bitcell while gradually step-ramping the write control voltage to the bitcell. Moreover, the ramp write technique 304B may further intermittently read and verify the logical state of the bitcell while gradually step-ramping the write control voltage to the bitcell.

Figure 4A:
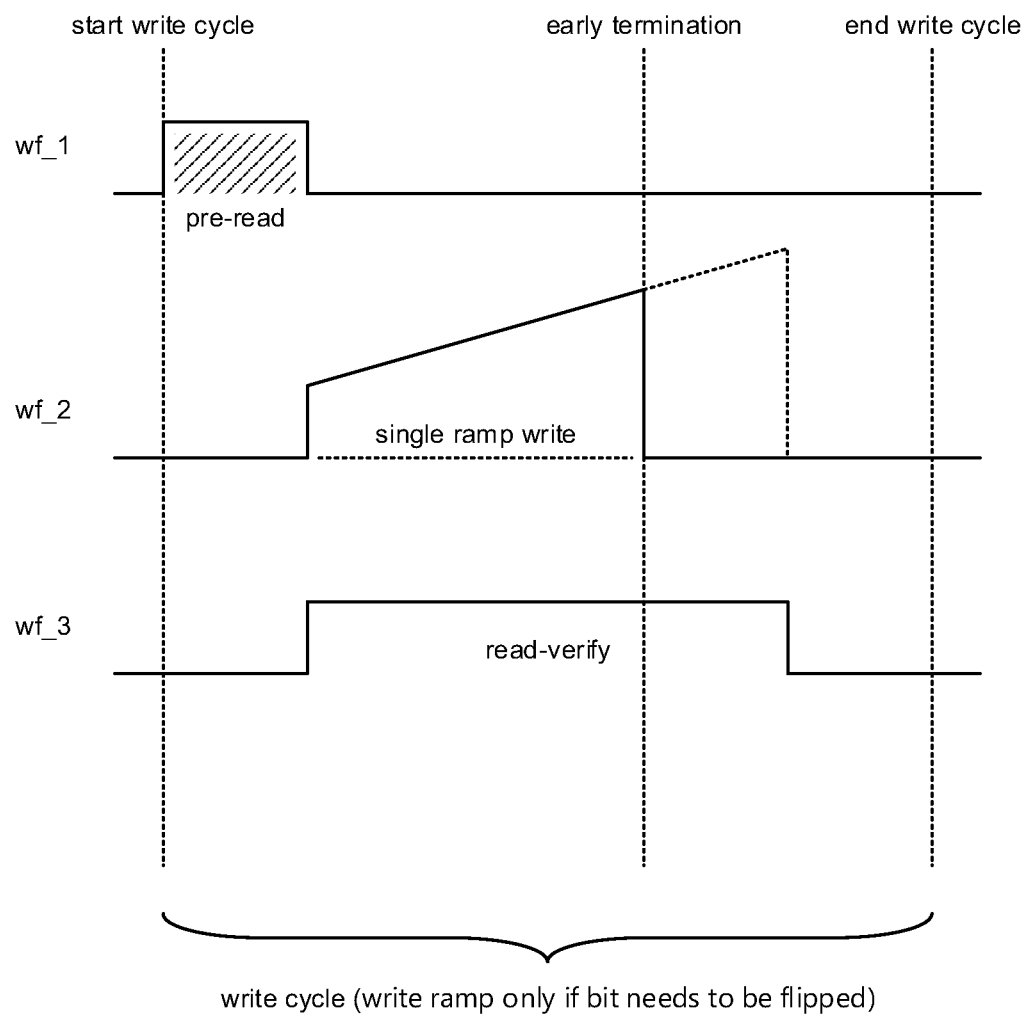
FIGS. 4A-4D illustrate various waveform diagrams of providing a ramp write technique in accordance with various implementations described herein.
Figure 4B:
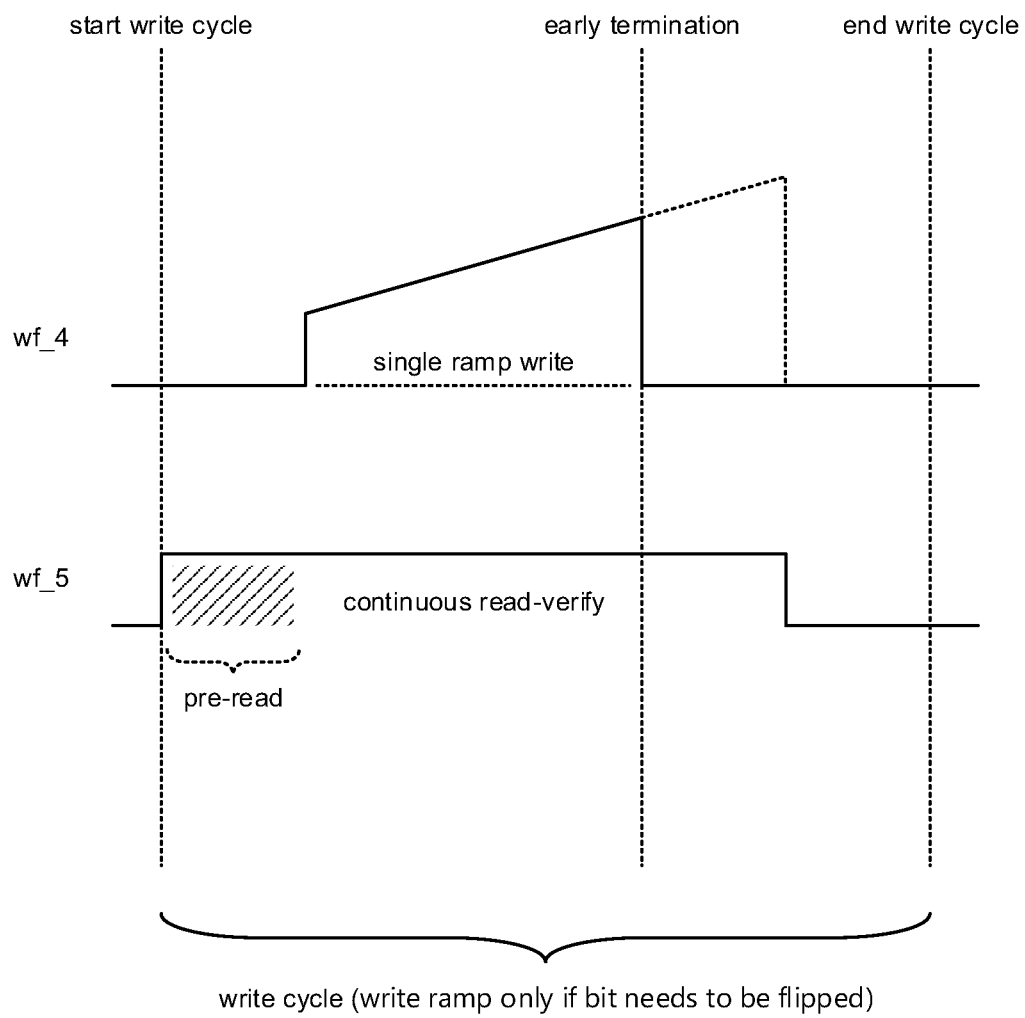
Figure 4C:
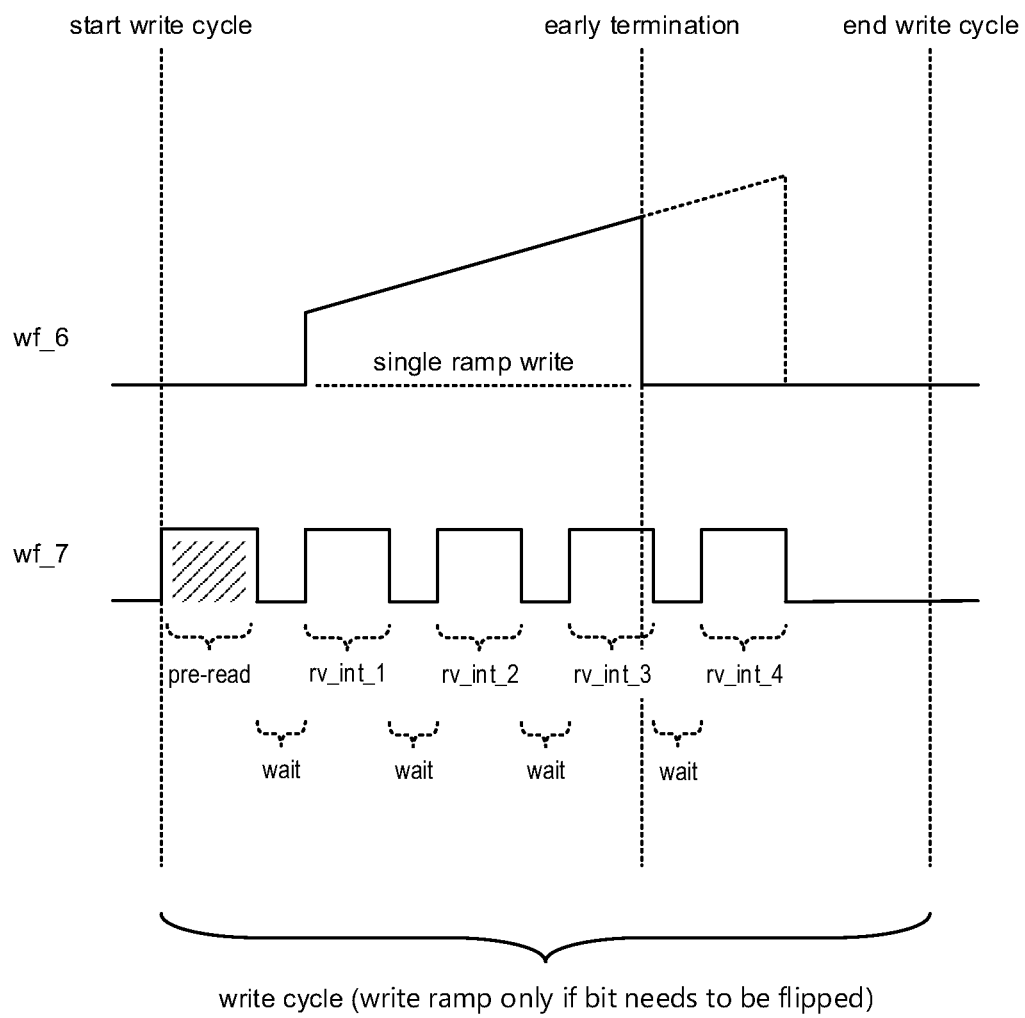
Figure 4D:
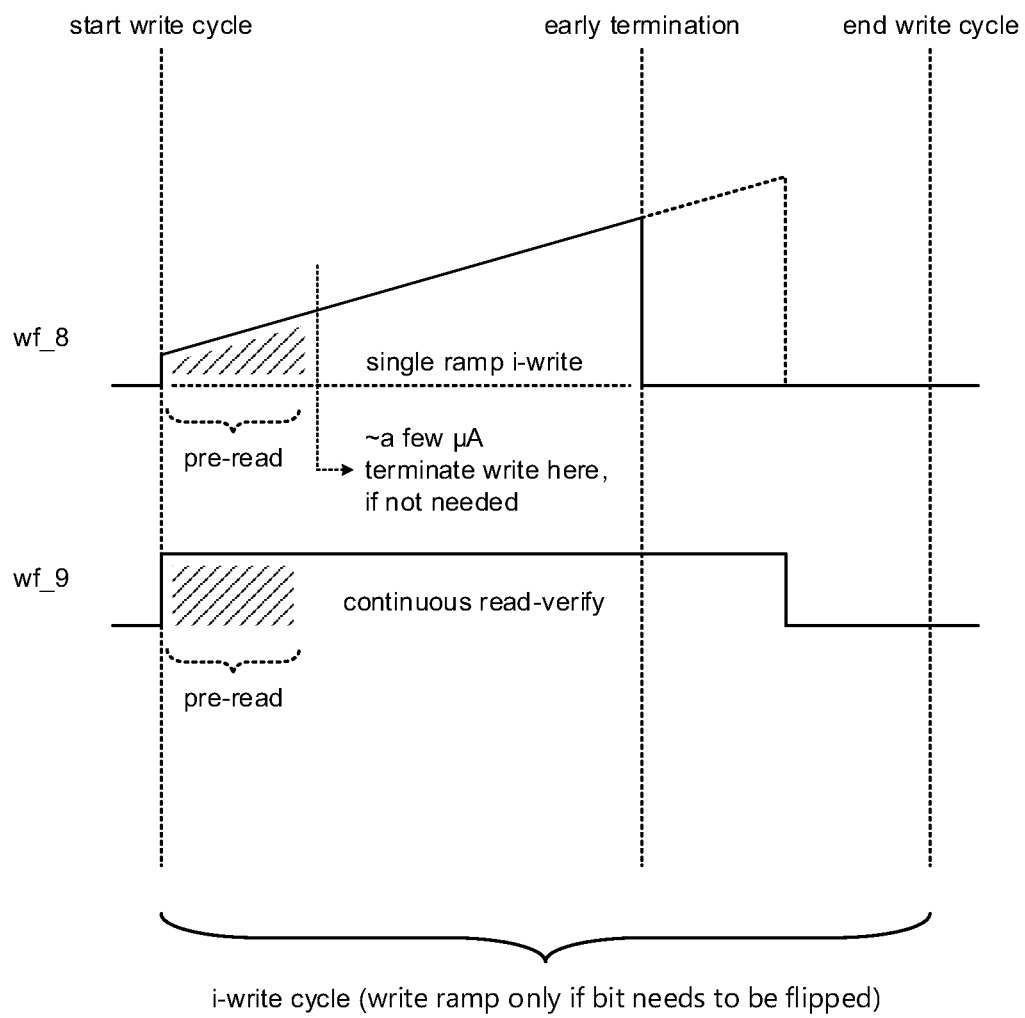

FIGS. 4A-4D illustrate various waveform diagrams of providing a ramp writing technique in accordance with implementations described herein. In particular, FIG. 4A shows a waveform diagram 400A of providing a ramp write technique 404A with a single ramp write and pre-read, FIG. 4B shows a waveform diagram 400B of providing a ramp write technique 404B with a single ramp write and continuous read-verify, FIG. 4C shows a waveform diagram 400C of providing a ramp write technique 404C with a single ramp write and multiple read-verify pulse related intervals. Moreover, in some instances, FIG. 4D shows another waveform diagram 400D of providing a ramp write technique 404D with a single ramp i-write and continuous read-verify.

In some implementations, the ramp write techniques 404 may be implemented with a system or a device having integrated circuit (IC) components that are arranged and coupled together as an assemblage or combination of parts that provide for physical circuit designs and related structures. In some instances, a method of implementing and using the ramp write technique 404 with an integrated system or device may involve use of the various IC circuit components described herein so as to implement ramp writing schemes and techniques associated therewith. The ramp write technique 404 may be implemented and used by computing circuitry and related components on a single chip in reference to embedded systems for automotive, electronic, mobile, server and IoT applications.

FIG. 4A shows a waveform diagram 400A of providing a ramp write technique 404A with a single ramp write interval and a pre-read interval. In some implementations, as shown in FIG. 4A, the ramp write technique 404A may implement and involve use of a write cycle that provides a write ramp only if and/or when a data-bit needs to be changed or flipped. In some instances, the write cycle may refer to a single write cycle that has a start line and an end line along with an early termination line. The ramp write technique 404A may provide a waveform (wf_1) that refers to a pre-read operation that operates to pre-read a bitcell and verify as to whether the current (old) data state of the bitcell is equal to the new data state of the bitcell. If the data state of the bitcell needs to be changed or flipped, then the ramp write technique 404A may provide a waveform (wf_2) that refers to a single ramp write that slowly, gradually and continuously increases from an abrupt start edge to an abrupt end edge when early termination occurs. Also, the ramp write technique 404A may provide a third waveform (wf_3) that refers to a read-verify operation that reads the bitcell and verifies as to when a bitcell write has occurred. As described herein, when a write occurs in a bitcell, then early termination of the single ramp write occurs.

FIG. 4B shows a waveform diagram 400B of providing a ramp write technique 404B with a single ramp write interval and with a continuous read-verify interval. In some implementations, as shown in FIG. 4B, the ramp write technique 404B may implement and involve use of a write cycle that provides a write ramp only if and/or when a data-bit needs to be changed or flipped. In some instances, the write cycle may refer to a single write cycle that has a start line and an end line along with an early termination line. Also, the ramp write technique 404B provides a waveform (wf_5) that has a pre-read operation that operates to pre-read a bitcell and verify as to whether the current (old) data state of the bitcell is equal to the new data state of the bitcell. If the data state of the bitcell needs to be changed or flipped, then the ramp write technique 404B provides a waveform (wf_4) that refers to a single ramp write that slowly, gradually and/or continuously increases from an abrupt start edge to an abrupt end edge when early termination occurs. Also, the ramp write technique 404B may also provide the waveform (wf_5) with a continuous read-verify operation that reads the bitcell and verifies as to when a bitcell write has occurred. When a write occurs in a bitcell, then early termination of the single ramp write occurs.

FIG. 4C shows a waveform diagram 400C of providing a ramp write technique 404C with a single ramp write interval and multiple read-verify pulse related intervals with multiple wait intervals. In various implementations, as shown in FIG. 4C, the ramp write technique 404C may implement and involve use of a write cycle that provides a write ramp only if and/or when a data-bit needs to be changed or flipped. In some implementations, the write cycle may refer to a single write cycle having a start line, an end line and an early termination line. In some instances, the ramp write technique 404C provides a waveform (wf_7) with a pre-read interval that operates to pre-read a bitcell and verify as to whether the current (old) data state of the bitcell is equal to the new data state of the bitcell. Also, if the data state of the bitcell needs to be changed or flipped, then the ramp write technique 404C provides a waveform (wf_6) that refers to a single ramp write that slowly, gradually and/or continuously increases from an abrupt start edge to an abrupt end edge when early termination occurs. Also, in some instances, the ramp write technique 404C may provide the waveform (wf_7) with multiple read-verify pulse intervals (rv_int_1, rv_int_2, rv_int_3, rv_int_4) that read the bitcell and verify as to when a bitcell write has occurred. Further, multiple wait intervals (wait) are provided in-between each of the multiple read-verify pulse intervals (rv_int_1, rv_int_2, rv_int_3, rv_int_4). As described herein, when a write occurs in a bitcell, then early termination of the single ramp write occurs.

FIG. 4D shows a waveform diagram 400D of providing a ramp write technique 404D with a single ramp i-write and continuous read-verify. In some implementations, as shown in FIG. 4D, the ramp write technique 404D may implement and involve use of an i-write cycle that provides for an i-write ramp only if and/or when the data-bit needs to be changed or flipped. In some instances, the i-write cycle may refer to a single i-write cycle that has a start line and an end line along with an early termination line. The ramp i-write technique 404D provides a waveform (wf_9) that has a pre-read operation that operates to pre-read a bitcell and verify as to whether the current (old) data state of the bitcell is equal to a new data state of the bitcell. If the data state of the bitcell needs to be changed or flipped, then the ramp i-write technique 404D provides a waveform (wf_8) that refers to a single ramp i-write that slowly, gradually and/or continuously increases from an abrupt start edge to an abrupt end edge when early termination occurs. In some instances, the single ramp—write may terminate the i-write shortly after the pre-read ends, wherein a few µA may be applied so as to terminate the i-write, if not needed. Also, the ramp i-write technique 404D may provide the waveform (wf_9) with a continuous read-verify operation that reads the bitcell and verifies as to when a bitcell write has occurred. As such, when a write occurs in a bitcell, then early termination of the single ramp write occurs.

Figure 5:
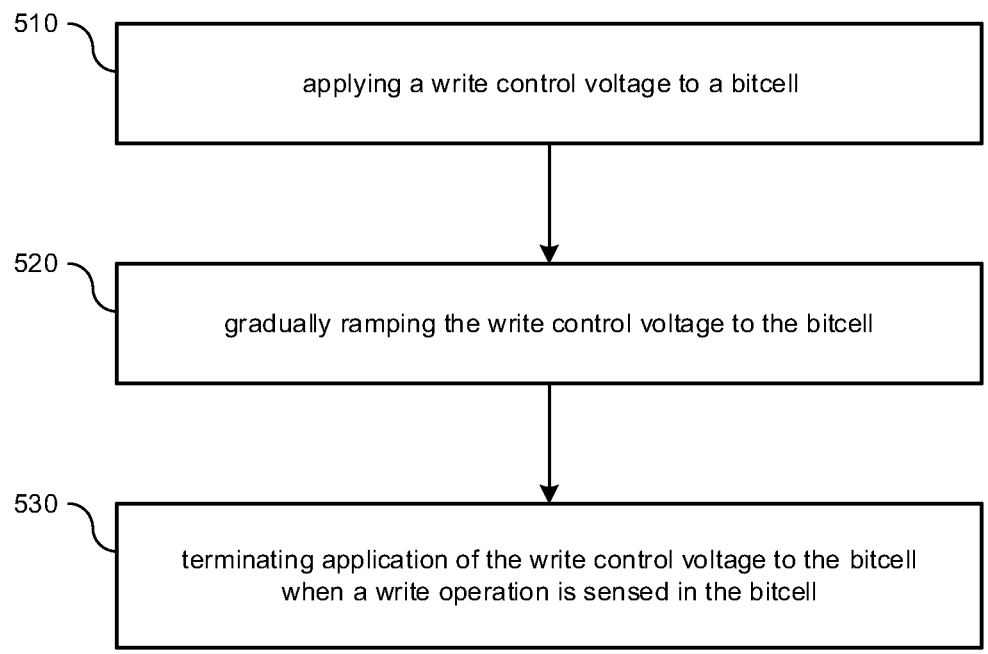
FIG. 5 illustrates a diagram of a method for applying a ramp writing technique to a bitcell in accordance with various implementations described herein.

FIG. 5 illustrates a process flow diagram of a method 500 for applying a ramp writing technique to a bitcell in accordance with implementations described herein.

It should be understood that even though the method 500 indicates a particular order of operation execution, in some cases, various particular portions of the operations may be executed in a different order, and on different systems. In other cases, additional operations and/or steps may be added to and/or omitted from method 500. Also, method 500 may be implemented in hardware and/or software. If implemented in hardware, the method 500 may be implemented with various components and/or circuitry, as described herein in reference to FIGS. 1-4C. Also, if implemented in software, method 500 may be implemented as a program and/or software instruction process configured for providing various ramp write schemes and techniques, as described herein. Also, if implemented in software, various instructions associated with implementing method 500 may be stored in memory and/or a database. For instance, various types of computing devices having a processor and memory may be configured to perform method 500.

In various implementations, method 500 may refer to a method of designing, providing, building, fabricating and/or manufacturing various non-volatile memory (NVM) cells as an integrated device that may involve use of various components and materials described herein. The non-volatile memory (NVM) cells may be integrated with computing circuitry and related components on a single chip, and the non-volatile memory cell may be implemented in various embedded systems for various electronic, mobile and/or Internet-of-things (IoT) applications, including remote sensor nodes.

At block 510, method 500 may apply a write control voltage to a bitcell. At block 520, method 500 may gradually ramp the write control voltage to the bitcell. Also, at block 530, method 500 may terminate application of the write control voltage to the bitcell when a write operation is sensed in the bitcell. In some implementations, gradually ramping the write control voltage to the bitcell refers to gradually increasing the write control voltage to the bitcell so as to provide one or more of improved endurance, faster write speed and energy savings. Moreover, in some implementations, gradually ramping the write control voltage to the bitcell may refer to abruptly increasing the write control voltage to the bitcell in an initial phase followed by gradually increasing the write control voltage to the bitcell during a continuous ramping phase.

In various implementations, method 500 may generate the write control voltage for the bitcell with various types of circuitry, such as, e.g., capacitor based circuitry, so as to slowly, gradually and/or continuously increase the write control voltage over a period of time during a write cycle. Also, method 500 may pre-read and pre-verify the logical state of the bitcell prior to applying the write control voltage to the bitcell. Also, method 500 may continuously read and verify a logical state of the bitcell while gradually ramping the write control voltage to the bitcell. Further, method 500 may intermittently read and verify a logical state of the bitcell while gradually ramping the write control voltage to the bitcell. Moreover, method 500 may sense when the write operation occurs by sensing a change in a logical state of the bitcell, generate a shut-off control signal when the change in the logical state of the bitcell is sensed, and apply the shut-off control signal to a write driver that is coupled to the bitcell so that the write driver terminates application of the write control voltage to the bitcell when change in the logical state of the bitcell is sensed.

In various implementations, method 500 may be performed within a single ramp cycle of a write cycle. Also, the bitcell refers to a non-volatile memory (NVM) bitcell, such as, e.g., a magneto-resistive random access memory (MRAM) bitcell having a transistor component and a resistor component. However, any other type of NVM bitcell may also be used to achieve similar results of the ramp writing techniques disclosed herein.

Figure 6:
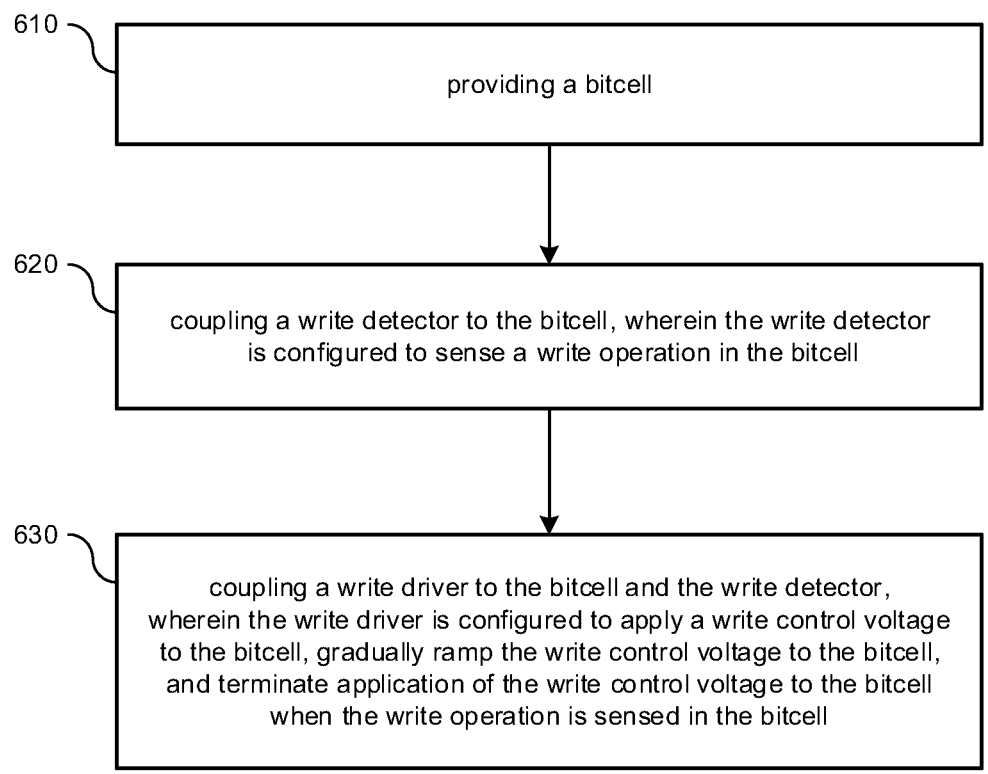
FIG. 6 illustrates a diagram of a method for providing ramp writing circuitry in accordance with various implementations described herein.

FIG. 6 illustrates a process flow diagram of a method 600 for providing ramp writing circuitry in accordance with various implementations described herein.

It should be understood that even though the method 600 indicates a particular order of operation execution, in some cases, various particular portions of the operations may be executed in a different order, and on different systems. In other cases, additional operations and/or steps may be added to and/or omitted from method 600. Also, method 600 may be implemented in hardware and/or software. If implemented in hardware, the method 600 may be implemented with various components and/or circuitry, as described herein in reference to FIGS. 1-5. Also, if implemented in software, the method 600 may be implemented as a program and/or software instruction process configured for providing various ramp write schemes and techniques, as described herein. Further, if implemented in software, various instructions associated with implementing method 600 may be stored in memory and/or a database. For instance, various types of computing devices having a processor and memory may be configured to perform method 600.

In various implementations, method 600 may refer to a method of designing, providing, building, fabricating and/or manufacturing various non-volatile memory (NVM) cells as an integrated device that may involve use of various components and materials described herein. The non-volatile memory (NVM) cells may be integrated with computing circuitry and related components on a single chip, and the non-volatile memory cell may be implemented in various embedded systems for various electronic, mobile and/or Internet-of-things (IoT) applications, including remote sensor nodes.

At block 610, method 600 may provide (or fabricate) a bitcell, and at block 620, method 600 may couple a write detector to the bitcell. In some implementations, the write detector is configured to sense a write operation in the bitcell. At block 630, method 600 may couple a write driver to the bitcell and the write detector. In various implementations, the write driver is configured to apply the write control voltage to the bitcell, gradually ramp the write control voltage to the bitcell, and terminate application of the write control voltage to the bitcell when the write operation is sensed in the bitcell.

In various instances, the write driver gradually ramps the write control voltage to the bitcell by gradually increasing the write control voltage to the bitcell. Also, the write driver may gradually ramp the write control voltage to the bitcell by abruptly increasing the write control voltage to the bitcell in an initial phase followed by gradually increasing the write control voltage to the bitcell during a ramping phase. Also, the write driver generates the write control voltage for the bitcell with capacitor based circuitry (or similar circuitry) so as to slowly, gradually and continuously increase the write control voltage over a period of time during a write cycle.

In various instances, the write detector pre-reads and pre-verifies a logical state of the bitcell before the write driver applies the write control voltage to the bitcell, and the write detector continuously reads and verifies the logical state of the bitcell while the write driver gradually ramps the write control voltage to the bitcell. Also, the write detector may pre-read and pre-verify a logical state of the bitcell before the write driver applies the write control voltage to the bitcell, and the write detector may intermittently read and verify the logical state of the bitcell while the write driver gradually ramps the write control voltage to the bitcell. Also, the write detector senses when the write operation occurs by sensing a change in a logical state of the bitcell, and the write detector generates a shut-off control signal when the change in the logical state of the bitcell is sensed. Also, the write detector provides the shut-off control signal to the write driver so that the write driver terminates application of the write control voltage to the bitcell when the change in the logical state of the bitcell is sensed.

In various implementations, the write driver may gradually increase (or ramp) the write control voltage to the bitcell during a single ramp cycle of a write cycle. Also, the bitcell may refer to a non-volatile memory (NVM) bitcell, such as, e.g., a magneto-resistive random access memory (MRAM) bitcell having a transistor component and also a resistor component. However, any other type of NVM bitcell may also be used to achieve similar results of the ramp writing techniques disclosed herein.

Advantageously, the various schemes and techniques described herein above may provide for a ramp write operation with intelligence (e.g., continuous verify) that has the following effects. For instance, the ramp write operation may assist with compensating for MTJ corners, and also, the ramp write operation may improve endurance of the NVM bitcells. Also, the ramp write operation may be close to the highest achievable endurance from the bitcell itself, and the ramp write operation may assist with avoiding a precession time penalty between write operations. Moreover, the ramp write operation may reduce write power and write overhead with a continuous read mode of operation.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a method. The method may apply a write control voltage to a bitcell. The method may gradually ramp the write control voltage to the bitcell. The method may terminate application of the write control voltage to the bitcell when a write operation is sensed in the bitcell.

Described herein are various implementations of a device having a bitcell. The device may have a write detector that senses a write operation in the bitcell, and the device may have a write driver that applies a write control voltage to the bitcell, gradually ramps the write control voltage to the bitcell, and terminates application of the write control voltage to the bitcell when the write operation is sensed in the bitcell.

Described herein are various implementations of a method. The method may provide a bitcell. The method may couple a write detector to the bitcell, and the write detector may be configured to sense a write operation in the bitcell. The method may couple a write driver to the bitcell and the write detector, and also, the write driver may be configured to apply a write control voltage to the bitcell, gradually ramp the write control voltage to the bitcell, and terminate application of the write control voltage to the bitcell when the write operation is sensed in the bitcell.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, specific features and acts described above are disclosed as example forms of implementing the claims.

What is claimed is:

1. A method, comprising:
   coupling a bitcell between a bitline and a source line, wherein the bitcell is a non-volatile memory (NVM) bitcell having a transistor and a magnetic based resistor coupled between the bitline and the source line;
   pre-reading a logical state of the bitcell using a write detector;
   applying a write control voltage to the bitcell using a write driver via the bitline or the source line based on pre-reading the logical state using the write detector;
   gradually ramping the write control voltage to the bitcell using the write driver, comprising:
      receiving, at the write driver, a global write ramp (GWR) signal from a GWR generator, wherein a voltage associated with the GWR signal is configured to gradually increase over a period of time during a write cycle; and
      gradually ramping the write control voltage to the bitcell using the write driver based on the gradual increase of the voltage associated with the GWR signal;
   sensing a write operation in the bitcell via the source line using the write detector; and
   terminating application of the write control voltage to the bitcell using the write driver when the write operation is sensed in the bitcell using the write detector.

2. The method of claim 1, wherein gradually ramping the write control voltage to the bitcell further comprises gradually increasing or gradually step-ramping the write control voltage to the bitcell so as to provide one or more of improved endurance, faster write speed and energy savings.

3. The method of claim 1, wherein gradually ramping the write control voltage to the bitcell further comprises abruptly increasing the write control voltage to the bitcell in an initial phase followed by gradually increasing or gradually step-ramping the write control voltage to the bitcell during a continuous ramping phase.

4. The method of claim 1, further comprising:
generating the write control voltage for the bitcell so as to gradually increase the write control voltage over the period of time during the write cycle.

5. The method of claim 1, wherein;
pre-reading the logical state of the bitcell using the write detector comprises determining a first data-bit value stored in the bitcell using the write detector; and
applying the write control voltage to the bitcell using the write driver comprises applying the write control voltage to the bitcell via the bitline or the source line only if the first data-bit value is different from a desired data-bit value for the bitcell.

6. The method of claim 1, further comprising:
continuously reading and verifying the logical state of the bitcell using the write detector while gradually ramping the write control voltage to the bitcell using the write driver.

7. The method of claim 1, further comprising:
intermittently reading and verifying the logical state of the bitcell using the write detector while gradually ramping the write control voltage to the bitcell using the write driver.

8. The method of claim 1, wherein:
applying the write control voltage to the bitcell comprises applying the write control voltage directly to the bitcell using the write driver via the bitline or the source line;
sensing the write operation in the bitcell comprises sensing when the write operation occurs by sensing, using the write detector, a change to a data-bit value stored in the bitcell; and
terminating the application of the write control voltage to the bitcell comprises:
generating a shut-off control signal using the write detector when the change to the data-bit value stored in the bitcell is sensed using the write detector; and
applying the shut-off control signal to the write driver so that the write driver terminates the application of the write control voltage to the bitcell when the change to the data-bit value stored in the bitcell is sensed using the write detector, wherein the write driver is coupled to the bitcell.

9. The method of claim 1, wherein the method is performed within a single ramp cycle of the write cycle.

10. The method of claim 1, wherein the bitcell comprises a non-volatile memory cell.

11. The method of claim 1, wherein the magnetic based resistor has a magnetic tunneling junction (MTJ) interposed between a pinned layer (PL) and a free layer (FL).

12. The method of claim 1, wherein the bitcell comprises a magneto-resistive random access memory (MRAM) bitcell having the transistor and the magnetic based resistor coupled in series between the bitline and the source line.

13. The method of claim 1, wherein:
applying the write control voltage to the bitcell comprises applying the write control voltage to the bitcell via the bitline; and
gradually ramping the write control voltage to the bitcell further comprises gradually ramping the write control voltage to the bitcell via the bitline while the source line is kept at ground.

14. The method of claim 1, wherein:
applying the write control voltage to the bitcell comprises applying the write control voltage to the bitcell via the source line; and
gradually ramping the write control voltage to the bitcell further comprises gradually ramping the write control voltage to the bitcell via the source line while the bitline is kept at ground.

15. A device, comprising:
a bitcell coupled between a bitline and a source line, wherein the bitcell is a non-volatile memory (NVM) bitcell having a transistor and a magnetic based resistor coupled between the bitline and the source line;
a write detector coupled to the bitcell, wherein the write detector is configured to at least:
pre-read a logical state of the bitcell; and
sense a write operation in the bitcell via the source line; and
a write driver coupled to the bitcell and the write detector, wherein the write driver is configured to at least:
apply a write control voltage to the bitcell via the bitline or the source line based on pre-reading the logical state using the write detector;
gradually ramp the write control voltage to the bitcell via the bitline or the source line, comprising:
receive a global write ramp (GWR) signal from a GWR generator, wherein a voltage associated with the GWR signal is configured to gradually increase over a period of time during a write cycle; and
gradually ramp the write control voltage to the bitcell based on the gradual increase of the voltage associated with the GWR signal; and
terminate application of the write control voltage to the bitcell when the write operation is sensed in the bitcell using the write detector.

16. The device of claim 15, wherein the write driver configured to at least gradually ramp the write control voltage to the bitcell is further configured to gradually ramp or gradually step-ramp the write control voltage to the bitcell by gradually increasing the write control voltage to the bitcell.

17. The device of claim 15, wherein the write driver configured to at least gradually ramp the write control voltage to the bitcell is further configured to gradually ramp or gradually step-ramp the write control voltage to the bitcell by abruptly increasing the write control voltage to the bitcell in an initial phase followed by gradually increasing the write control voltage to the bitcell during a ramping phase.

18. The device of claim 15, wherein the write driver is further configured to generate the write control voltage for the bitcell so as to gradually and continuously increase the write control voltage over the period of time during the write cycle.

19. The device of claim 15, wherein the write detector configured to at least pre-read the logical state of the bitcell is further configured to:
continuously read and verify the logical state of the bitcell while the write driver gradually ramps the write control voltage to the bitcell.

20. The device of claim 15, wherein the write detector configured to at least pre-read the logical state of the bitcell is further configured to:
intermittently read and verify the logical state of the bitcell while the write driver gradually ramps the write control voltage to the bitcell.

21. The device of claim 15, wherein:
the write driver configured to at least apply the write control voltage to the bitcell is further configured to apply the write control voltage directly to the bitcell via the bitline or the source line;
the write detector configured to at least sense the write operation in the bitcell is further configured to sense when the write operation occurs by sensing a change to a data-bit value stored in the bitcell; and
the write detector is further configured to:
  generate a shut-off control signal when the change to the data-bit value stored in the bitcell is sensed using the write detector; and
  provide the shut-off control signal to the write driver so that the write driver terminates the application of the write control voltage to the bitcell when the change to the data-bit value stored in the bitcell is sensed using the write detector.

22. The device of claim 15, wherein the write driver configured to at least gradually ramp the write control voltage to the bitcell is further configured to gradually ramp the write control voltage to the bitcell during a single ramp cycle of the write cycle.

23. The device of claim 15, wherein;
the write detector configured to at least pre-read the logical state of the bitcell is further configured to determine a first data-bit value stored in the bitcell; and
the write driver configured to at least apply the write control voltage to the bitcell is further configured to apply the write control voltage to the bitcell via the bitline or the source line only if the first data-bit value is different from a desired data-bit value for the bitcell.

24. A method, comprising:
providing a bitcell;
coupling a bitline and a source line to the bitcell, wherein the bitcell is a non-volatile memory (NVM) bitcell having a transistor and a magnetic based resistor coupled between the bitline and the source line;
coupling a write detector to the bitcell via the bitline and the source line, wherein the write detector is configured to at least:
  pre-read a logical state of the bitcell; and
  sense a write operation in the bitcell via the source line; and
coupling a write driver to the bitcell and the write detector via the bitline and the source line, wherein the write driver is configured to at least:
  apply a write control voltage to the bitcell via the bitline or the source line based on pre-reading the logical state using the write detector;
  gradually ramp the write control voltage to the bitcell via the bitline or the source line, comprising:
    receive a global write ramp (GWR) signal from a GWR generator, wherein a voltage associated with the GWR signal is configured to gradually increase over a period of time during a write cycle; and
    gradually ramp the write control voltage to the bitcell based on the gradual increase of the voltage associated with the GWR signal; and
  terminate application of the write control voltage to the bitcell when the write operation is sensed in the bitcell using the write detector.

* * * * *